United States Patent [19]

Minton

[11] 3,733,556

[45] May 15, 1973

[54] COMPACT VARIABLE TIME BASE AND DELAYED PULSE OSCILLATOR

[75] Inventor: Alfred L. Minton, Camarillo, Calif.

[73] Assignee: The United States of America as represented by the Secretary of the Navy, Washington, D.C.

[22] Filed: Apr. 20, 1972

[21] Appl. No.: 245,919

[52] U.S. Cl. ......................328/39, 328/48, 328/129, 331/51, 331/74

[51] Int. Cl. ........................H03k 21/08, H03k 21/30

[58] Field of Search....................328/39, 48, 51, 129, 328/130; 331/51, 74

[56] References Cited

UNITED STATES PATENTS

| | | | |
|---|---|---|---|
| 3,050,685 | 8/1962 | Stuart | 328/48 |
| 3,369,183 | 2/1968 | Mester | 328/48 |
| 3,375,449 | 3/1968 | Ribour et al. | 328/48 |
| 3,383,525 | 5/1968 | Arksey | 328/129 X |

*Primary Examiner*—John S. Heyman
*Attorney*—Richard S. Sciascia

[57] ABSTRACT

A bi-functional oscillator possessing a range of several decades and with a selectively delayed output. Variable frequency pulses are obtainable from a series of dividers, with each decade range having a given delay period. Each successive divider decreases the lower frequency limit by a factor of ten and increases the output pulse delay by a similar factor of ten.

4 Claims, 2 Drawing Figures

COMPACT VARIABLE TIME BASE AND DELAYED PULSE OSCILLATOR

BACKGROUND OF THE INVENTION

The present invention relates to oscillators and particularly to a circuit to provide a reliable, efficient, and compact unit that will provide two oscillator functions with one adjustable control; that of a variable time base oscillator and a delayed pulse oscillator.

The old method of providing a variable time base oscillator is to use a general form of astable multivibrator which relies on the RC time constant principle. To provide decades of range with one potentiometer, capacitors whose values differ by multiples of ten are switched one at a time into the circuit to give the desired range. The disadvantage of this system is that capacitor tolerances are limited as to accuracy and the number of decade ranges available are limited by the size of the capacitors and the parameters of the circuit itself. The old method of providing a delay pulse oscillator is to initiate a timing circuit that triggers an output pulse circuit in a given interval of time later. The range and accuracy of such a timing circuit is limited by the same reasoning as that for the prior variable time base oscillator.

Variable time base oscillators and delayed pulse oscillators normally are separate units. Variable time base oscillators make use of a basic variable oscillator in which the capacitor values are interchanged to provide the various decades of range. The delayed pulse oscillator circuits consist of some sort of timing circuit that provides an output signal a given interval of time after an input pulse is injected. The time interval is usually arrived at by means of an RC time constant and the capacitor values are again interchanged to arrive at variable time delays. To provide an oscillator that is compact and has a dynamic range, the present circuit which makes use of common circuitry for both oscillator functions with great versatility and simplicity was created.

SUMMARY OF THE INVENTION

The present invention is compact and uses a minimum of components. Common circuitry is used for both variable time base oscillator and delayed pulse oscillator functions. Variable frequency pulses are obtained from a series of dividers with each decade range having a given delay period. Each successive divider decreases the lower frequency limit and similarly increases the output pulse delay.

Both oscillators combined in the circuit make use of the same integrated circuitry and variable control for all decades of range. The decade ranges are all available continuously and a rotary switch is all that is required to change from one range to another. The range is almost unlimited, being limited in upper frequency by the multivibrator and unlimited in lower frequency. There are many applications where such a unit as this is highly desirable since it has a dynamic range unattainable by other methods.

DESCRIPTION OF THE PREFERRED EMBODIMENT

Figures 1, 2:
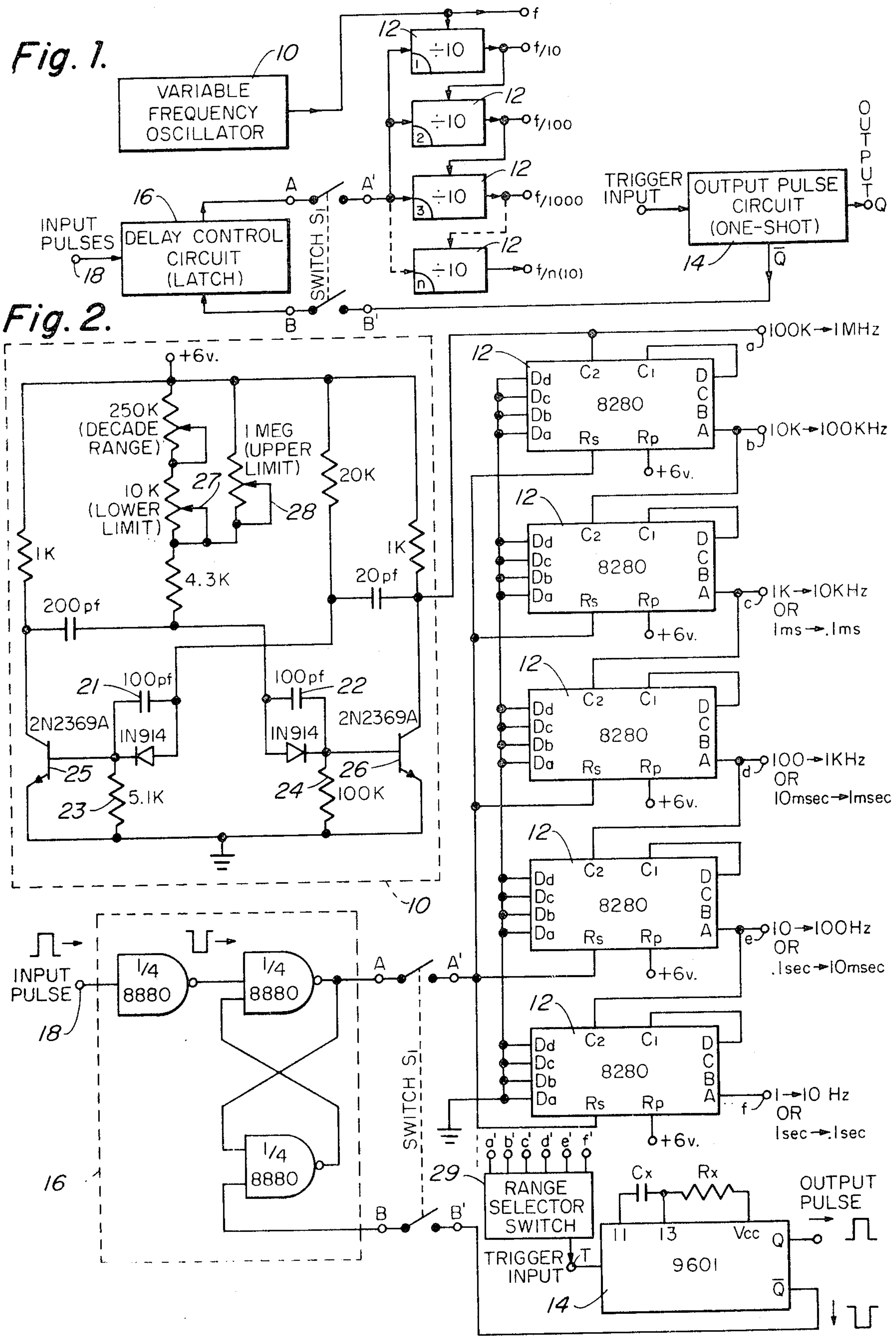
FIG. 1 is a block diagram of the combined variable time base and delayed pulse oscillator of the present invention.
FIG. 2 is a circuit diagram of one embodiment of the combined oscillator circuit of FIG. 1.

The combined oscillator circuit consists of a single decade range variable frequency oscillator 10, a series of divide-by-ten integrated circuits 12, a one-shot multivibrator 14, and a delay control circuit 16 which is actually a single integrated circuit quad two-input nand gate that is used primarily as a set-reset latch.

When used as a variable time base oscillator, the variable frequency decade range oscillator 10 is merely fed into a series of divide-by-ten integrated circuits 12. The desired frequency output (from $f, f/10, f/100, f/1000$ . . . . or $f/n$) is then chosen and fed to the trigger input to the one-shot 14 which puts out the desired width pulses at output Q. Oscillator 10 controls the frequency within a decade range of the output chosen. The reset line to the counters is left open such that they function continuously.

To use the circuit as a delayed pulse oscillator, the Q output of the one-shot is fed to one side of the latch 16 (delay control circuit). The latch also receives at 18 the input pulses to be delayed. The output of latch 16 controls the inhibit or reset line on all the dividers 12 so that they either act as frequency dividers or remain with "0" (gnd) outputs. This is accomplished by merely connecting points A–A$^1$ and B–B$^1$ via switch $S_1$ as shown in FIG. 1. When switch $S_1$ is open, the circuit operates in the variable time base mode and when switch $S_1$ is closed, operated in the delayed mode. The dividers 12 are initially inhibited. When the particular divider that is connected to the trigger input to one-shot 14 has divided the original oscillator 10 frequency by its particular location in the series of dividers, it actuates the one-shot 14. The one-shot now puts the output pulse out at the Q output and the Q output resets the latch 16, disabling the dividers 12, and the circuit waits for the next input pulse.

A more detailed circuit of the invention described above is shown in FIG. 2.

In the circuit shown in FIG. 2 a conventional astable multivibrator 10 with slight modification is used. Capacitors 21 and 22 and resistors 23 and 24 have been added in the base region of the transistors 25 and 26, respectively, to allow high speed operation, and a lower-limit potentiometer 27 and upper-limit potentiometer 28 have been added to allow the frequency to vary exactly a decade. In this case the output is from 100 KHz to 1 Megahertz. This output is then divided through a series of (e.g., Signetics 8280) divide-by-ten counters 12. The appropriately divided output is selected by means of a range selector switch 29 and is then fed into the trigger input terminal T to the (e.g., Fairchild 9601) one-shot circuit 14 producing the desired width output pulses at the Q output. A rotary switch, for example, can be used as the range selector switch 29 for selecting the desired frequency range. Terminals *a, b, c, d, e* and *f* are connected to terminals $a^1$, $b^1$, $c^1$, $d^1e$ $^1$ and $f^1$, respectively of range selector switch 29.

In the delayed pulse oscillator mode, DPST switch $S_1$ is closed an points A–A$^1$ and B–B$^1$ are connected together. The dividers 12 are now inhibited until an input pulse arrives at 18 and sets latch 16. After the appropriate division takes place, the one-shot 14 puts out a pulse at Q and Q resets latch 16 thus disabling the dividers until the next pulse arrives. It is important to note at this time that in the delayed pulse oscillator mode, the one-shot should not be connected to a frequency higher than $f/100$ in order to limit the pulse jitter to 1 percent. Each succeedingly lower frequency division provides a pulse jitter that is less by multiples of ten, (1 percent, 0.1 percent, 0.01 percent, etc.).

The combined variable time base and delay pulse oscillator just described has several special features. It makes maximum use of common circuitry and uses just one decade range oscillator 10 to provide the variable frequency and variable delayed output pulses for all decades of range. Once the lower and upper limits are set, they do not need to be adjusted for each different decade range. Only two connections (via one DPST switch $S_1$) are made to change the function of the circuit from that of a variable time base oscillator to a delayed pulse oscillator. Except for the discrete components used in the primary decade range oscillator and the two or three required for the one-shot, the remainder of the circuit is composed entirely of dual-in-line integrated circuits as shown in FIG. 2. Only one +6 volt supply, for example, is required for the entire circuit. There is no limit to the number of decade ranges desired because each additional divider decreases the lower limit of the frequency by a factor of ten and increases the output pulse delay by a factor of ten. Thus, this circuit provides a very compact, versatile, efficient, and simple way of obtaining a bi-functional oscillator unit for many system requirements.

Obviously, many modifications and variations of the present invention are possible in the light of the above teachings. It is therefore to be understood that within the scope of the appended claims the invention may be practiced otherwise than as specifically described.

What is claimed is:

1. A bi-functional oscillator network that operates both as a variable time base oscillator and as a delayed pulse oscillator, comprising a. a latch means which receives input pulses to be delayed, b. a series of divider means, c. a variable frequency oscillator whose output is connected to said series of divider means, d. a one-shot multivibrator which provides the desired network output, e. a range selector switch means connected to the output of said variable frequency oscillator and to the outputs of each of the series of divider means for selectively connecting any one thereof to the trigger input to said one-shot multivibrator, f. a second switch means for connecting an output pulse from said one-shot multivibrator to said latch means and for connecting the output of said latch means to each of said series of divider means for controlling the dividers so they act as frequency dividers or are inhibited, said network being in the delay mode of operation when said second switch is closed and in the variable time base mode when open, wherein when the divider means that is connected to said one-shot multivibrator via said range selector switch has divided the frequency output from said variable frequency oscillator, the divider means actuates said one-shot multivibrator to provide a network output pulse and a pulse to reset said latch means and inhibit said series of divider means.

2. A network as in claim 1 wherein said variable frequency oscillator is a single decade range oscillator.

3. A network as in claim 1 wherein said divider means are divide-by-ten integrated circuit means.

4. A network as in claim 1 wherein said latch means is a single integrated circuit quad two-input nand gate that is used as a set-reset latch.

* * * * *